United States Patent
Ying et al.

(10) Patent No.: US 6,964,928 B2
(45) Date of Patent: Nov. 15, 2005

(54) METHOD FOR REMOVING RESIDUE FROM A MAGNETO-RESISTIVE RANDOM ACCESS MEMORY (MRAM) FILM STACK USING A DUAL MASK

(76) Inventors: Chentsau Ying, 10370 N. Blaney Ave., Cupertino, CA (US) 95014; Xiaoyi Chen, 811 Volans La., Foster City, CA (US) 94404; Padmapani C. Nallan, 2200 Pettigrew Dr., San Jose, CA (US) 94086; Ajay Kumar, 510 Kenilworth Ct., Sunnyvale, CA (US) 94087

( * ) Notice: Subject to any disclaimer, the term of this patent is extended or adjusted under 35 U.S.C. 154(b) by 411 days.

(21) Appl. No.: 10/231,675

(22) Filed: Aug. 29, 2002

(65) Prior Publication Data

US 2004/0043620 A1 Mar. 4, 2004

(51) Int. Cl.[7] .............................. H01L 21/302
(52) U.S. Cl. .................. 438/706; 438/710; 438/720; 438/745; 134/1.1; 134/1.2
(58) Field of Search .................. 438/706, 710, 438/712, 714, 720, 745; 216/58, 67; 134/1.1, 1.2, 1.3

(56) References Cited

U.S. PATENT DOCUMENTS

| | | |
|---|---|---|
| 5,296,093 A * | 3/1994 | Szwejkowski et al. ........ 216/13 |
| 5,496,759 A | 3/1996 | Yue et al. .................... 437/52 |
| 5,607,599 A | 3/1997 | Ichihara et al. ............... 216/22 |
| 5,732,016 A | 3/1998 | Chen et al. .................. 365/158 |
| 5,920,500 A | 7/1999 | Tehrani et al. .............. 365/173 |
| 5,940,319 A | 8/1999 | Durlam et al. .............. 365/171 |
| 5,945,350 A * | 8/1999 | Violette et al. ............. 438/706 |
| 6,024,885 A | 2/2000 | Pendharkar et al. .......... 216/22 |
| 6,048,739 A | 4/2000 | Hurst et al. .................... 438/3 |
| 6,093,628 A * | 7/2000 | Lim et al. ................... 438/592 |
| 6,153,443 A | 11/2000 | Durlam et al. ................. 438/3 |
| 6,165,803 A | 12/2000 | Chen et al. .................... 438/3 |
| 6,174,737 B1 | 1/2001 | Durlam et al. ................. 438/3 |
| 6,365,419 B1 | 4/2002 | Durlam et al. ................. 438/3 |

* cited by examiner

*Primary Examiner*—Lan Vinh
(74) *Attorney, Agent, or Firm*—Moser, Patterson & Sheridan LLP.; Joseph Bach (57) ABSTRACT

A method for removal of residue after plasma etching a film stack comprising a patterned photoresist material layer, a hard mask layer, a conductive layer, and a magnetic layer, wherein the patterned photoresist material layer and the hard mask layer form a dual mask. The method cleans a substrate containing the film stack after the dual mask of the film stack has been etched to remove residue produced during the etching process. The cleaning step is performed in a solution comprising hydrogen peroxide and ammonium hydroxide that removes the residue.

20 Claims, 7 Drawing Sheets

FIG.9

METHOD FOR REMOVING RESIDUE FROM A MAGNETO-RESISTIVE RANDOM ACCESS MEMORY (MRAM) FILM STACK USING A DUAL MASK

BACKGROUND OF THE INVENTION

1. Field of the Invention

The present invention generally relates to a method for processing magneto-resistive random access memory (MRAM) film stacks. More specifically, the invention relates to a method for removal of residue after plasma etching a magneto-resistive random access memory (MRAM) film stack using a photoresist/silicon dioxide dual mask.

2. Description of the Related Art

Microelectronic devices are generally fabricated on a semiconductor substrate as integrated circuits. An example of such a device is a magneto-resistive random access memory (MRAM) wherein magnetic multilayer films, or film stacks, are used as storage elements. The magnetic multi-layer films are typically a stack of different layers composed of various materials, for example permalloy (NiFe), cobalt iron (CoFe), tantalum (Ta), copper (Cu) and the like, and may also contain insulator materials such as aluminum oxide as a thin tunneling layer sandwiched between the multi-layers. The layers are typically deposited in overlying blanket films, layer by layer, and then featured. One of the typical processes used during feature fabrication is plasma etching, in which one or more layers comprising a film stack are removed, either partially or in total to form a feature.

During the plasma etching process, a metal film (or film stack) is etched using a plasma, for example a plasma comprising fluorine or chlorine chemistry. In such an example, the fluorine or chlorine from the etchant combines with the removed metal to form a residue. For example, if a film contains tantalum, a plasma etch process utilizing chlorine ($Cl_2$) will form tantalum chloride (TaCl) residue. Additionally, if a carbon-based photoresist is used during metal etching, a metal-containing polymer may also form as an additional residue resulting from the etch process.

The residues typically deposit or redeposit along the sidewalls of the layer or film stack. These residues, for example, can be redeposition of the material just removed from the layer along the sidewalls of the film or film stack. Additionally, the residues may include a by-product of the plasma etchant reacting with the removed metal and this by-product residue being deposited along the sidewalls of the film or film stack. Such residues may build up along the sides of the film or film stack above the upper surface of the film or film stack, forming a "veil" like structure.

Residues containing metal, metal chlorides, fluorides, oxides and polymers interfere with further processing of the film or film stack. These residues may contaminate any additional films or layers that are deposited upon the remaining metal and/or the film or film stack. Additionally, the residues, and especially the veil-like structures, can cause electrical short-circuits, for example as between the two magnetic layers separated by a thin tunneling layer within a MRAM device, and other problems, as well as causing film stack irreproducibility.

Therefore, there is a need in the art for a method of removing residues after plasma etching a magneto-resistive random access memory (MRAM) film stack.

SUMMARY OF THE INVENTION

The disadvantages of the prior art are overcome by a method for removal of residue after plasma etching a magneto-resistive random access memory (MRAM) film stack. The film stack contains a photoresist layer, a hard mask layer, a conductive layer, a layer or layers of magnetic material and a tunneling layer. The hard mask layer is used in conjunction with the photoresist layer as a dual mask for etching a layer or layers of magnetic material. Following an etching of the hard mask layer and conductive layer using chlorine-based or fluorine based chemistry, the residues, including the presence of any "veil"-like structures, are removed using a wet dip in a mixture of ammonium hydroxide, hydrogen peroxide and water.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method for removal of residue produced by plasma etching a magneto-resistive random access memory (MRAM) film stack. The film stack contains a photoresist layer, an anti-reflective coating layer, a hard mask layer, a conductive layer, a layer or layers of magnetic material and a tunneling layer. The film stack may contain additional layers to form a complete MRAM device. The hard mask layer is used in conjunction with the photoresist and the anti-reflective coating layer, as a dual mask for etching a layer or layers of magnetic material to the tunneling layer. Following a chlorine-based or fluorine-based chemistry etching of the hard mask layer and conductive layer, the residues, including the presence of any "veil"-like structures, are removed using a wet dip in a mixture of ammonium hydroxide, hydrogen peroxide and water.

Figure 1:
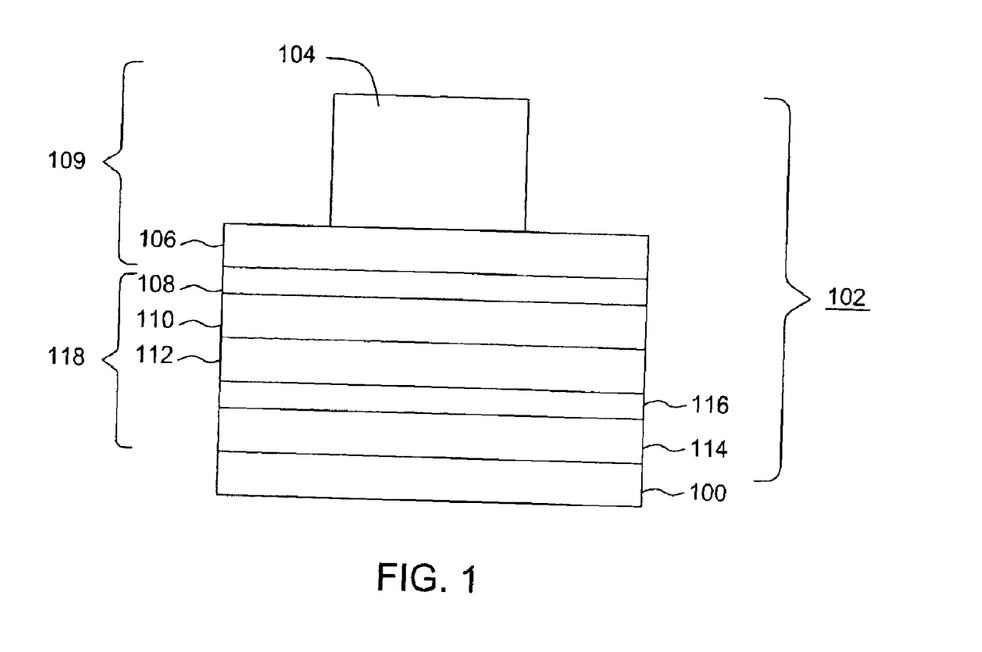
FIG. 1 depicts a schematic cross-sectional view of a substrate having a film stack.

FIG. 1 is a schematic cross-sectional view of a substrate 100 before the photoresist strip and plasma etching. In this example, the substrate 100 comprises a film stack 102. The film stack comprises a photoresist layer 104, an anti-reflective coating layer 106 (a bottom anti-reflective coating or BARC), hard mask layer 108, conductive layer 110, magnetic layers 112, 114, separated by a thin tunneling layer 116. Layers 112, 114 and 116 form a magnetic tunnel junction 118.

The layer 104 of photoresist material is conventionally processed using a lithographic patterning routine, i.e., the photoresist is applied to a surface of the wafer, exposed through a mask, and developed. The developed photoresist is generally a carbon-based polymer that remains only on top of the stack 102 in the areas that are to be protected during plasma etch. As the feature size of the lithographic pattern is reduced, inaccuracies in the pattern transfer process can arise from optical limitations inherent in the lithographic process, for example light reflection. The bottom anti-reflective coating layer 106 (or BARC) positioned between the underlying hard mask layer 108 and the photoresist layer 104 controls the reflection of light from the underlying metal or metal-containing layers. In some instances a BARC layer is not used. As such, the BARC layer is considered optional. The anti-reflective coating layer is typically composed of various materials, including organic and inorganic materials, and may include, for example, inorganic materials such as silicon nitride, silicon oxynitride, titanium nitride, silicon carbide, and the like, and organic materials such as polyamides and polysulfones. Together, layers 104 and 106 have a thickness of about 6000 Angstroms.

The underlying hard mask layer 108 is formed from, for example, silicon dioxide and boron or phosphorus doped or undoped silicon dioxide, and has a thickness of about 500 Angstroms. Other hard mask materials (e.g., SiN, SiON, and the like) that are known in the art may also be used. Together, the photoresist layer 104, the anti-reflective layer 106 and the silicon oxide layer 108 form a dual mask 109.

The conductive layer 110 is formed, for example, from either tantalum (Ta) or tantalum nitride (TaN) and has a thickness of about 300–600 Angstroms. The magnetic layers 112 and 114 are formed from, for example, magnetic materials such as nickel and cobalt iron alloys, such as CoFe, NiFe and the like, and each layer may consist of one or more sub-layers of a combination of these alloys. The magnetic layers 112 and 114 have a thickness of about 50–100 Angstroms for layer 112 and of about 300–400 Angstroms for layer 114. The thin tunneling layer 116 is composed of an insulating material, such as for example alumina ($Al_2O_3$) and has a thickness, for example, of about 10–15 Angstroms.

Figure 2:
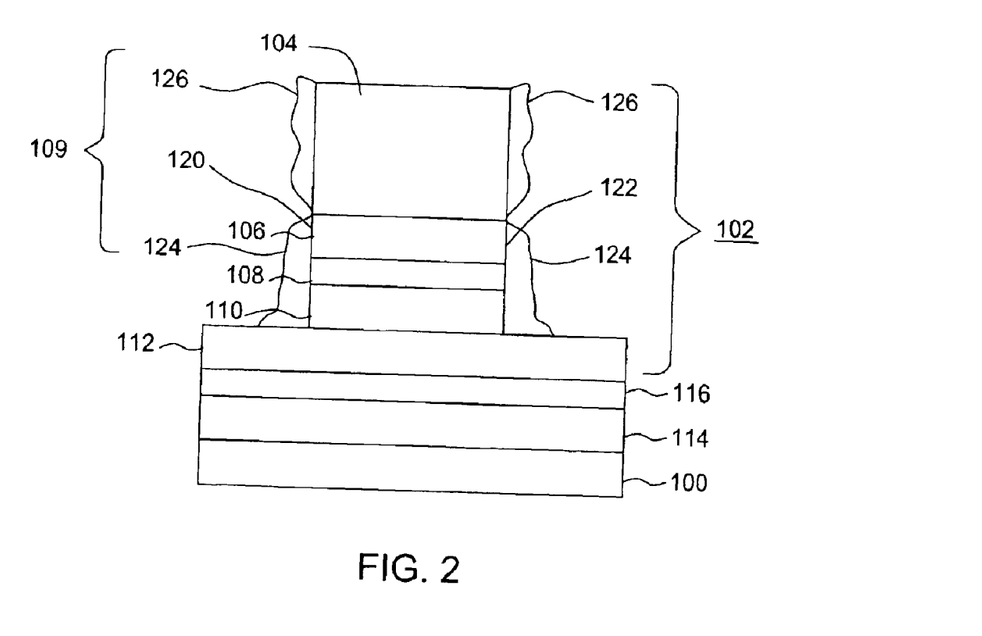
FIGS. 2–5 depict a schematic cross-sectional views of a film stack of FIG. 1 after intermediate processing steps in accordance with one example of the inventive method.

FIG. 2 is a schematic cross-sectional view of the film stack 102 after plasma etching is completed. Either chlorine-based or fluorine-based conventional chemistries, such as for example $Cl_2$, HCl, $CF_4$ or $CHF_3$, can be used during plasma etching of the conductive layer metals such as tantalum or tantalum nitride. Plasma etching can be performed in a Decoupled Plasma Source (DPS) II module of the Centura® metal etch system, available from Applied Materials, Inc. of Santa Clara, Calif. The DPS II module uses a 2 MHz inductive plasma source to generate and sustain high density plasma. A wafer is biased by a 13.56 MHz bias source. The decoupled nature of the plasma source allows independent control of ion energy and ion density. The DPS II module provides a wide process window over changes in source and bias power, pressure, and etch gas chemistry and uses an endpoint system to determine an end of the etch process. The DPS II module is discussed in detail with respect to FIG. 9 below.

During a first plasma etching of the film stack 102, some amount of the metal (e.g., tantalum) from the layer 110 is etched from the stack and becomes deposited on the top and sidewalls of the photoresist layer 104. The anti-reflective coating layer 106 and the hard mask layer 108 not covered by the photoresist layer 104 are also etched and materials from these layers may also become deposited on the top and sidewalls of the photoresist layer 104. The photoresist layer 104 may also be partially dissolved by the etchant. During the etch process, the etched metal combines with the components of the etchant (for example, chlorine or fluorine) as well as with components of the photoresist and may also combine with the etched components of the anti-reflective coating layer 106 and hard mask layer 108. A residue 124 containing, for example, metal, metallic-chloride or metallic-fluoride as well as metal-containing polymers, as well as other possible combinations from the etched anti-reflective coating and hard mask layer components, is deposited on the sidewalls 120 and 122 of the film stack 102 or elsewhere on the substrate. As a result of this residue generation, after the first plasma etching, residue 124 remains on the sidewalls 120 and 122, but also may remain and extend above the surface of the top-most layer, the photoresist layer 104, to form a veil 126. The residue is considered a contaminant with respect to further processing of the substrate.

Figure 3:
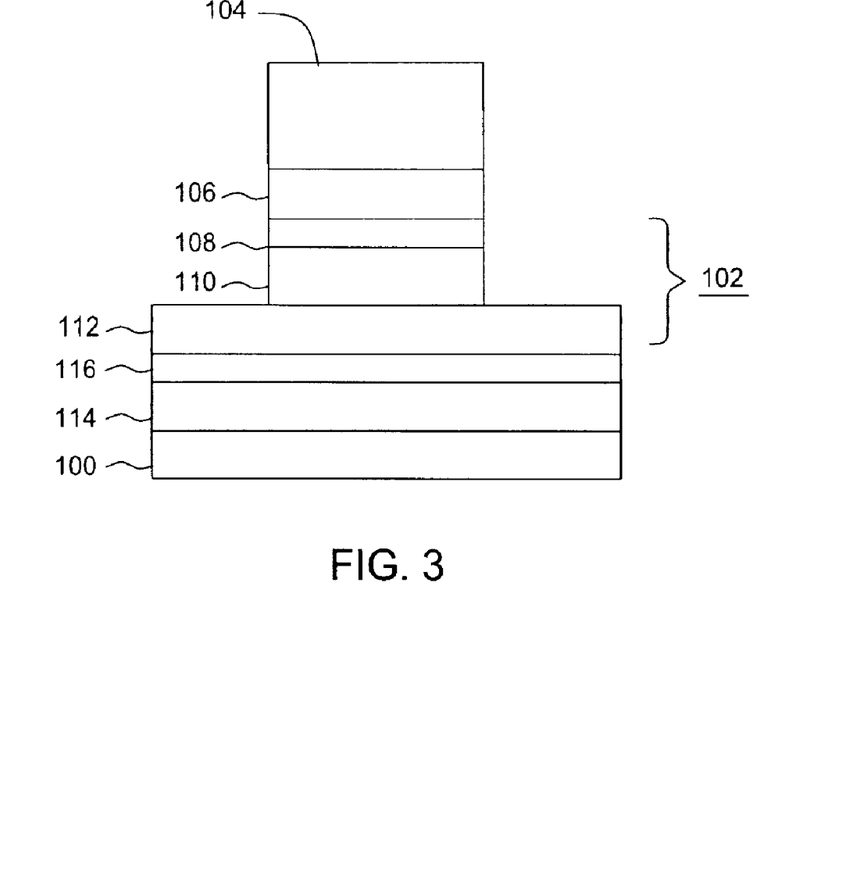

The residue 124 is removed by post-first plasma-etch processing the substrate in a wet dip solution comprising ammonium hydroxide, hydrogen peroxide and water. FIG. 3 depicts a schematic cross-sectional view of the film stack 102 after the wet dip in accordance with one example of the present invention. As shown, the wet dip has removed the etch residue.

Figure 4:
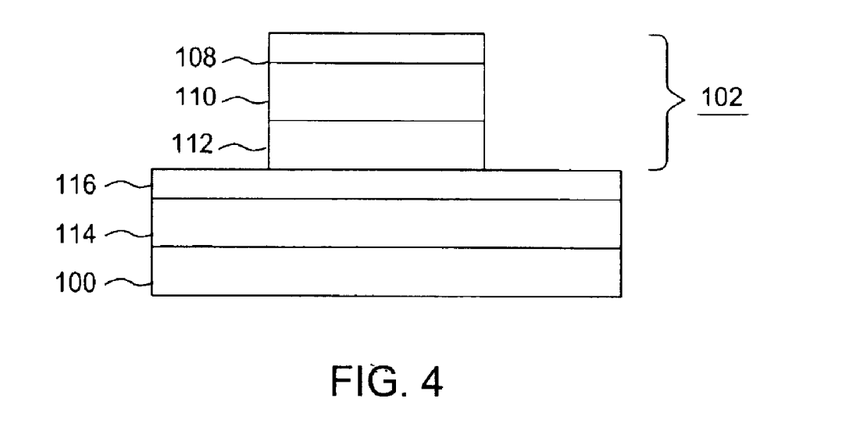

The photoresist material in layer 104 and anti-reflective coating material in layer 106 are then removed by conventional photoresist stripping techniques, such as for example, plasma stripping and passivation processes or wet chemical etching. FIG. 4 depicts a schematic cross-sectional view of the film stack 102 after photoresist stripping of photoresist layer 104 and anti-reflective coating layer 106.

Figure 5:
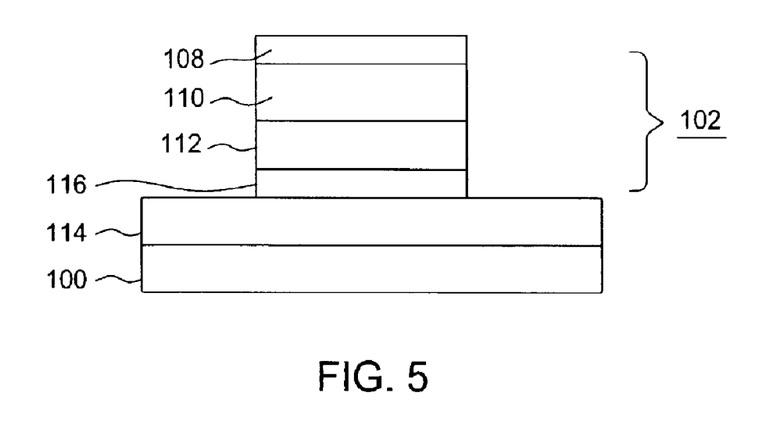

FIG. 5 is a schematic cross-sectional view of the film stack 102 after a oxygen and chlorine-mixed chemistry plasma etch, i.e. a second plasma etch, is completed in accordance with one example of the present invention. Any oxygen-based and chlorine-based chemistries, such as for example oxygen and chlorine plasma, may be utilized during etching of the magnetic layer 112 to the thin tunneling layer 116. The tunneling layer 116 can be used as an etch stop layer. The hard mask layer 108 forms a hard mask that protects the underlying layers of the film stack 102, thus permitting high selectivity and etching of the second plasma etch to the tunneling layer.

During the oxygen and chlorine-mixed chemistry etch of the film stack as depicted in FIG. 5, the hard mask layer 108 and the conductive layer 110 are not etched and act together as a hard mask over the underlying layers 112, 114 and 116. The magnetic layer 112 not covered by the mask of layer 108 and the conductive layer 110 is etched. The hard mask layer 108 remains smooth and substantially residue free after the oxygen and chlorine-mixed chemistry etch.

Figure 6:
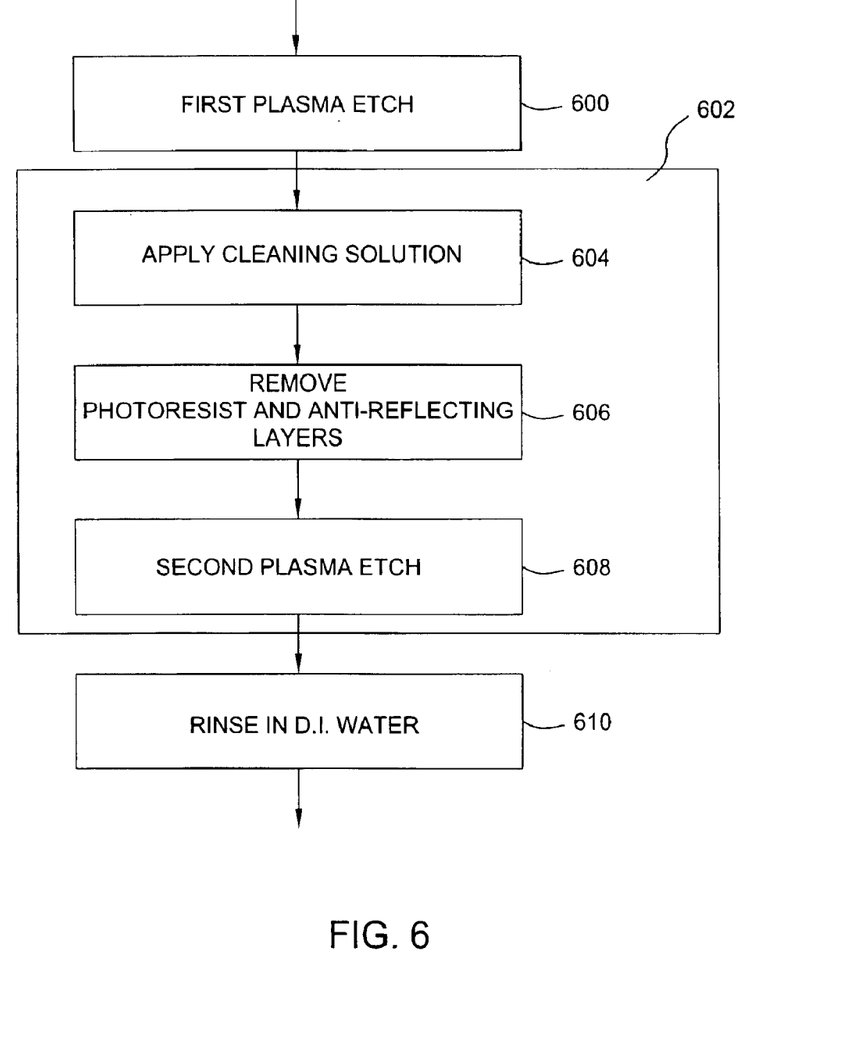
FIG. 6 depicts a flow diagram of an example of the inventive method.

FIG. 6 is a flow diagram of an example of one embodiment of the inventive method 602 for post-plasma-etch processing the substrate to remove etch residue. At step 600, a film stack that comprises a layer or layers of metals undergoes a first plasma etching. During step 600, a residue forms on the side walls of the film stack or elsewhere on the substrate. In one embodiment of the first plasma etch of step 600, the wafer temperature was about 10 to 80 degrees Celsius, pressure and flow of the reactant gases $CF_4$ and $CHF_3$ were about 1 to 30 mTorr and 10 to 200 sccm of each gas and plasma excitation power was about 200 to 300 Watts. Argon is used as a diluent at a flow rate of about 10 to 200 sccm. The cathode pedestal bias power was about 0 to 500 Watts. One specific recipe used in a DPS II module provides 60 sccm of $CF_4$, 20 sccm of $CHF_3$, 60 sccm of Ar, applying 1000 Watts of plasma excitation power and 50 Watts of cathode pedestal bias power, and maintaining the substrate temperature at 40 degrees Celsius and a pressure in the reactor of 10 mtorr.

At step 604, the substrate is dipped in a solvent to remove the residue in accordance with one embodiment of the invention. In one embodiment, the solvent solution of step 604 comprises hydrogen peroxide, ammonium hydroxide and deionized water. In particular, the ratio of the ammonium hydroxide to hydrogen peroxide to deionized water ranges from about 1 to 1 to 10 to about 0.1 to 1 to 10 by volume. Duration of the cleaning step is generally between about 1 to about 2 minutes, though longer cleaning periods may be used. During cleaning, the solvent solution has a temperature of about 45 to 75 degrees Celsius. In one specific example, the solvent solution has a temperature of 65 degrees Celsius and the duration of the cleaning step is 2 minutes.

After step 604, the photoresist and underling anti-reflective coating layer are removed by step 606, leaving a hard mask layer as the top layer of the film stack. The plasma stripping of the photoresist and anti-reflective coating layers of step 604 is a process generally performed using a microwave downstream, oxygen plasma reactor. The process can be performed in the Advanced Strip and Passivation (ASP) module of the Centura® metal etch system, available from Applied Materials, Inc. of Santa Clara, Calif. The ASP module is a microwave downstream oxygen plasma reactor in which the plasma is confined to a plasma tube and only reactive neutrals are allowed to enter a process chamber. Such a plasma confinement technique precludes plasma-related damage of the substrate or circuits formed on the substrate. In the ASP module, wafer backside is heated radiantly by quartz halogen lamps and the wafer temperature can be maintained between about 200 to about 300 degrees Celsius.

In one embodiment of the invention, the photoresist and BARC layers are removed in the ASP module by supplying between 500 and 5000 sccm of $O_2$, between 0 and 1000 sccm of $N_2$, applying between 200 to 3000 Watts to excite a plasma, and maintaining a wafer temperature between 150 to 400 degrees Celsius and a pressure in the reactor between 1 to 10 Torr. In this embodiment of the invention, good results were observed with the oxygen-based reactant gas. One specific process recipe provides 3500 sccm of $O_2$, 300 sccm of $N_2$, applies 1400 Watts to excite a plasma, and maintains a wafer temperature at 200 degrees Celsius and a pressure in the reactor at 2 Torr.

The photoresist stripping can also be performed in-situ in the DPS II module. In one embodiment of the invention, in the DPS II chamber, the photoresist and BARC layers are removed by supplying between 50 and 200 sccm of $O_2$, between 0 and 50 sccm of $N_2$, applying power to an inductively coupled antenna about 1000 Watts, applying a cathode electrode bias power about 10 Watts, and maintaining a wafer temperature about 40 degrees Celsius and a pressure in the reactor about 30 mTorr for a duration of about 120 seconds. In this embodiment of the invention, a duration of the stripping process may be between 1 and 8 minutes.

Following step 606, the film stack undergoes step 608 wherein a second plasma etching is performed using oxygen and chlorine-mixed chemistries. During step 608, a second residue forms on the side walls of the film stack or elsewhere on the substrate. In one embodiment of the invention, the magnetic layer 112 is etched in the DPS II module by supplying between 10 and 50 sccm of $O_2$, between 10 and 100 sccm of $Cl_2$, between 10 and 100 sccm of Ar, applying power to an inductively coupled antenna between 200 to 3000 Watts, applying a cathode electrode bias power between 0 to 300 Watts, and maintaining a wafer temperature between 40 to 500 degrees Celsius and a pressure in the reactor between 1 to 2 mtorr. One specific process recipe provides 20 sccm of $O_2$, 40 sccm of $Cl_2$, 20 sccm of Ar, applying 900 Watts to the antenna and 100 Watts to the cathode electrode, and maintaining a wafer temperature at 40 degrees Celsius and a pressure in the reactor at 5 mtorr.

At step 610, a deionized (DI) water rinse is performed to remove any remaining traces of residue. The result is an MRAM film stack etched to the tunneling layer.

Figure 9:
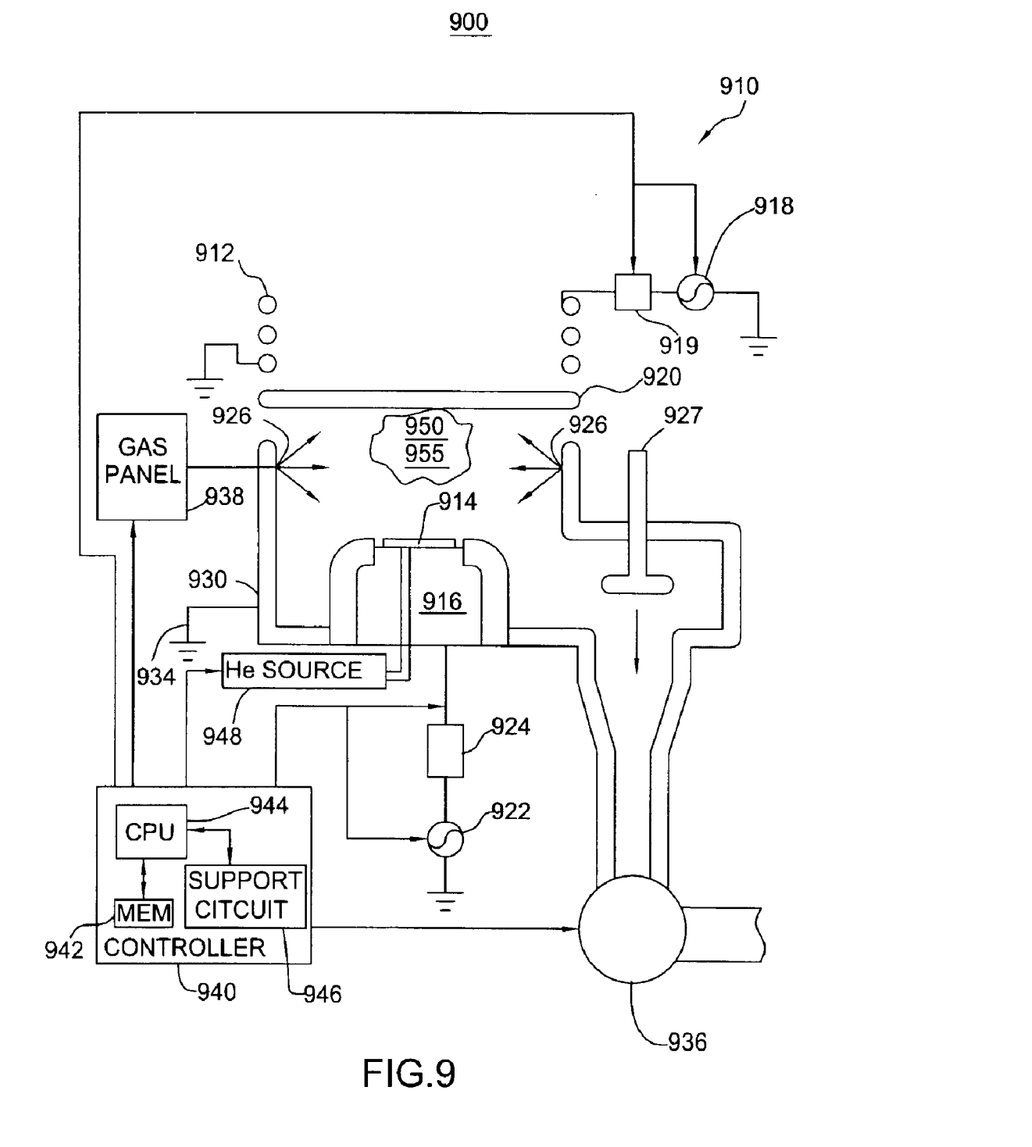
FIG. 9 depicts a schematic, cross sectional view of an illustrative etch module.

FIG. 9 depicts a schematic diagram of the DPS II etch reactor 900 that may be uses to practice the inventive method. The process chamber 910 comprises at least one inductive coil antenna segment 912, positioned exterior to a dielectric ceiling 920. Other modifications may have other types of ceilings, e.g., a dome-shaped ceiling. The antenna segment 912 is coupled to a radio-frequency (RF) source 918 that is generally capable of producing an RF signal having a tunable frequency of about 50 kHz and 13.56 MHz. The RF source 918 is coupled to the antenna 912 through a matching network 919. Process chamber 910 also includes a wafer support pedestal (cathode) 916 that is coupled to a source 922 that is generally capable of producing an RF signal having a frequency of approximately 13.56 MHz. The source 922 is coupled to the cathode 916 through a matching network 924. Optionally, the source 922 may be a DC or pulsed DC source. The chamber 910 also contains a conductive chamber wall 930 that is connected to an electrical ground 934. A controller 940 comprising a central processing unit (CPU) 944, a memory 942, and support circuits 946 for the CPU 944 is coupled to the various components of the DPS etch process chamber 910 to facilitate control of the etch process.

In operation, the semiconductor wafer 914 is placed on the wafer support pedestal 916 and gaseous components are supplied from a gas panel 938 to the process chamber 910 through entry ports 926 to form a gaseous mixture 950. The gaseous mixture 950 is ignited into a plasma 955 in the process chamber 910 by applying RF power from the RF sources 918 and 922 respectively to the antenna 912 and the cathode 916. The pressure within the interior of the etch chamber 910 is controlled using a throttle valve 927 situated between the chamber 910 and a vacuum pump 936. The temperature at the surface of the chamber walls 930 is controlled using liquid-containing conduits (not shown) that are located in the walls 930 of the chamber 910.

The temperature of the wafer 914 is controlled by stabilizing the temperature of the support pedestal 916 and flowing helium gas from source 948 to channels formed by the back of the wafer 914 and grooves (not shown) on the pedestal surface. The helium gas is used to facilitate heat transfer between the pedestal 916 and the wafer 914. During the processing, the wafer 914 is heated by a resistive heater within the pedestal to a steady state temperature and the helium facilitates uniform heating of the wafer 914. Using thermal control of both the ceiling 920 and the pedestal 916, the wafer 914 is maintained at a temperature of between 0 and 500 degrees Celsius. The RF power applied to the inductive coil antenna 912 has a frequency between 50 kHz and 13.56 MHz and has a power of 200 to 2500 Watts. The bias power of between 0 and 300 Watts is applied to the pedestal 916 may be in a form of a DC, pulsed DC, or RF power.

To facilitate control of the chamber as described above, the CPU 944 may be one of any form of general purpose computer processor that can be used in an industrial setting for controlling various chambers and sub-processors. The memory 942 is coupled to the CPU 944. The memory 942, or computer-readable medium, may be one or more of readily available memory such as random access memory (RAM), read only memory (ROM), floppy disk, hard disk, or any other form of digital storage, local or remote. The support circuits 946 are coupled to the CPU 944 for supporting the processor in a conventional manner. These circuits include cache, power supplies, clock circuits, input/output circuitry and subsystems, and the like. The inventive method is generally stored in the memory 942 as software routine. The software routine may also be stored and/or executed by a second CPU (not shown) that is remotely located from the hardware being controlled by the CPU 944.

Figure 7:
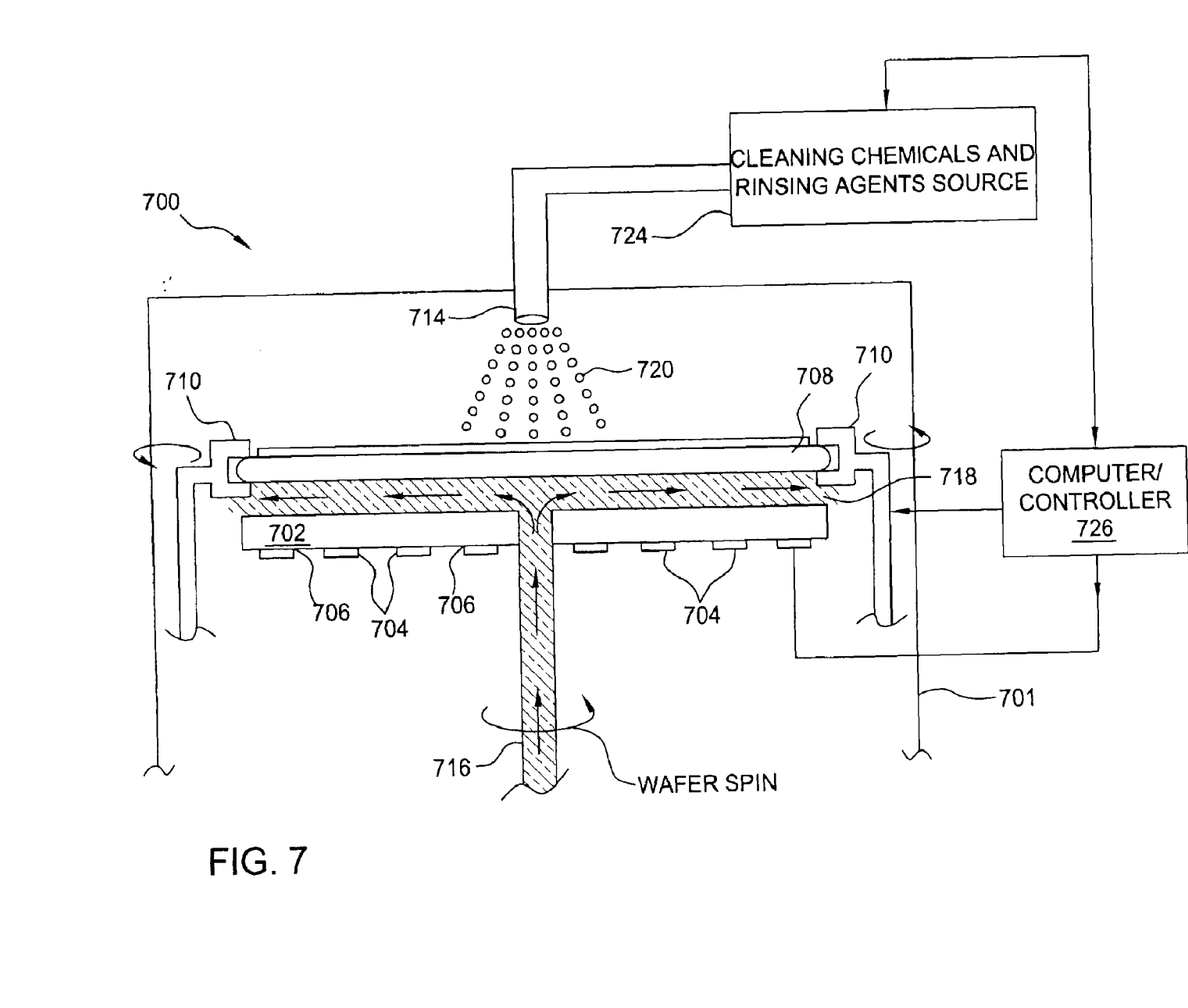
FIG. 7 depicts a schematic, cross sectional view of an illustrative wet dip cleaning module.

One illustrative embodiment of an apparatus that can be used for cleaning and rinsing a substrate in accordance with the present invention is a single substrate wet cleaning module. FIG. 7 depicts a simplified cross-sectional view of an illustrative embodiment of a single substrate wet cleaning module 700. The module 700 is described in detail in U.S. patent application Ser. No. 09/945,454, filed Aug. 31, 2001, which is herein incorporated by reference.

The module 700 applies cleaning chemicals and/or rinsing agents to the top and bottom of a substrate. To enhance the cleaning process, the module 700 uses acoustic or sonic waves to agitate the cleaning chemicals and/or rinsing agents.

The module 700 comprises a chamber 701, a nozzle 714, and a substrate support 712. The substrate support is mounted within the chamber 701 and comprises edge claps 710, plate 702 and a plurality of acoustic or sonic transducers 704. The plate 702 has a shape that is substantially the same as a substrate and supports the plurality of acoustic or sonic transducers 704. The plate 702 is, for example, made of aluminum, but can be formed of other materials such as, but not limited to, stainless steel and sapphire. The plate 702 is coated with a corrosion resistant fluoropolymer such as HALAR or PFA. The transducers 704 are attached to the bottom of the plate 702 using an adhesive, for example, an epoxy 706. In one embodiment of the cleaning module 700, the transducers 704 are arranged in an array that covers substantially the entire bottom surface of plate 702, e.g., approximately 80% of plate 702. The transducers generate sonic waves in the frequency range between 400 kHz and 8 MHz. In one embodiment of the module 700, the transducers are piezoelectric devices.

The plurality of edge clamps 710 retain the substrate 708 face up above the plate 708 to form a gap 718 between the backside of the wafer and the top surface of the plate 702. The gap 718 is approximately 3 mm. Cleaning chemicals and/or rinsing agents are provides to the gap via channel 716. The clamps are rotated to cause the substrate 708 to rotate about its central axis at a rate between 0 and 6000 rpm. In this embodiment of module 700, the substrate 708 and clamps 710 rotate, while the plate 702 is stationary.

The nozzle 714 sprays cleaning chemicals and/or rinsing agents upon the top of the substrate 708 (i.e., the surface of the substrate comprising features, transistors, or other circuitry). As the nozzle 714 sprays the top of the substrate 708, the same or different cleaning chemicals and/or rinsing agents are supplied to the gap 718 via channel 716 as the substrate is rotated such that the cleaning chemicals and/or rinsing agents flow across the top and bottom surfaces of the substrate.

The nozzle 714 and channel 716 are coupled to a source 724 of cleaning chemicals and/or rinsing agents. The source 724 may be the same for the nozzle 714 and channel 716, or a separate source may be couple to each of the nozzle 714 and channel 716. In the present embodiment of the invention, the module 700 is used to clean the substrate 708 using hydrogen peroxide, ammonium hydroxide and deionized water. The module 700 is further used to rinse the substrate in deionized water.

A computer controller 726 is generally used to control the operation of the module 700. Specifically, the computer controller 726 controls the rotation of the substrate support 712, the activation of the transducers 704, the supply of cleaning chemicals and/or rinsing agents, and so on.

Figure 8:
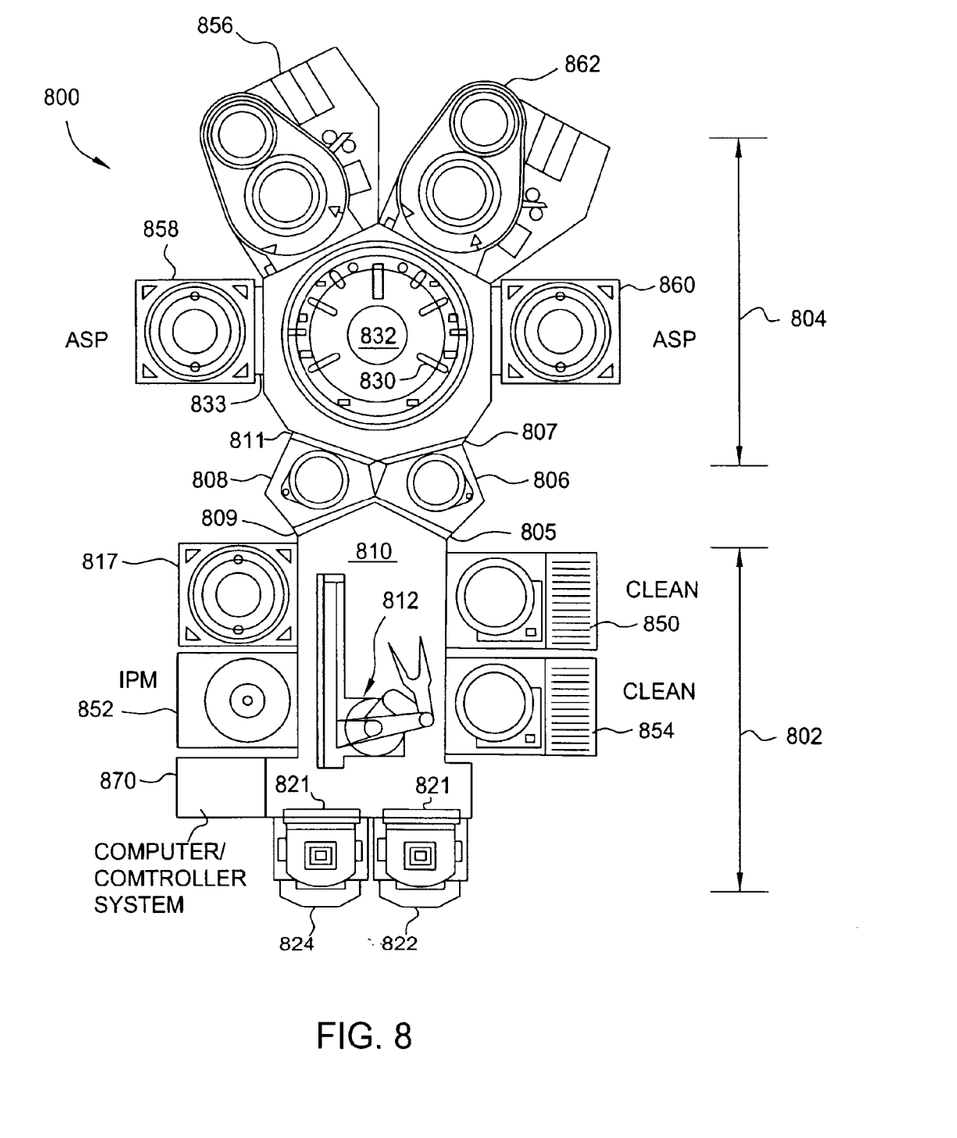
FIG. 8 depicts a schematic view of an illustrative platform for performing the method of the present invention.

The method of the present invention (FIG. 6) is illustratively performed on an integrated processing platform 800 shown in FIG. 8 that comprises apparatus for performing both atmospheric and sub-atmospheric processing. The platform 800 and the various modules and tools that can be used with such a platform are described in detail in U.S. patent application Ser. No. 09/945,454, filed Aug. 31, 2001, which is herein incorporated by reference.

Depending upon the process modules that are used in the platform 800, the platform 800 (also referred to as a process tool) can be used to perform etching, substrate cleaning, photoresist stripping, substrate inspection and the like. The platform 800 comprises an atmospheric platform 802 and a sub-atmospheric platform 804. The sub-atmospheric platform 804 and the atmospheric platform 802 may be coupled together by a single substrate load lock 806 or, as shown in the depicted example, are coupled together by a pair of single load locks 806 and 808. In some applications, the sub-atmospheric and atmospheric platforms 804 and 802 are not coupled together and may be used separately. One such stand-alone platform configuration may contain photoresist stripping modules and wet cleaning modules from providing a platform that performs post-etch processing.

The atmospheric platform 802 comprises a central atmospheric transfer chamber 810 containing a substrate handling device 812, such as a robot. Directly attached to the atmospheric transfer chamber 810 is a substrate wet cleaning module 850, an integrated particle monitor 852 and a critical dimension (CD) measuring tool 854. A strip or dry clean module 817 can also be attached to the atmospheric transfer chamber 810, if desired. Each module or tool is coupled to the transfer chamber 810 by a separately closable and sealable opening, such as a slit valve. The transfer chamber is maintained at substantially atmospheric pressure during operation. The substrate handling device 812 is able to transfer substrates from one module or tool to another module or tool that is attached to the atmospheric transfer chamber 810. In the embodiment shown, the substrate handling device 812 is a dual blade, single arm, single wrist robot. Other types of robots may be used to access the various modules and tools.

The atmospheric transfer chamber 810 is coupled to at least one substrate input/output module 820 that provides and receives substrates to and from the platform 800. In one embodiment of the platform 800, the module 820 comprises at least one front opening unified pod (FOUP). Two FOUPs 822 and 824 are depicted. The substrate handling device 812 accesses each FOUP through a sealable access door 821. The substrate handling device 812 moves linearly along a track 823 to facilitate access to all of the modules and tools.

The atmospheric transfer chamber 810 is coupled to the pair of load locks 806 and 808 through sealable doors 805 and 809 such that the substrate handling device 812 can access the load locks 806 and 808. The sub-atmospheric platform 804 comprises a central sub-atmospheric transfer chamber 830 and a plurality of process chambers 856, 858, 860, and 862. Sealable doors 807 and 811 respectively couple each load lock 806 and 808 to the sub-atmospheric transfer chamber 830. The sub-atmospheric transfer chamber 830 contains a substrate handing device 832, such as a robot, that accesses the load locks 806 and 808 as well as the process chambers 856, 858, 860 and 862. The process chambers 856, 858, 860 and 862 are each coupled to the sub-atmospheric transfer chamber 830 via separately closable and sealable openings, such as slit-valves. The process chambers 856, 858, 860 and 862 may comprise one or more etching chambers such as the DPS or DPS II chamber that are available from Applied Materials, Inc. of Santa Clara, Calif. Additionally, one or more photoresist stripping chambers such as the ASP chamber described above may be used as one or more of the process chambers 856, 858, 860 and 862. As also described above, the ASP chamber, if used, may be located either on the sub-atmospheric platform 804 or the atmospheric platform 802. FIG. 8 shows the sub-atmospheric platform 804 comprising two etch chambers 858 and 860 and two photoresist stripping chambers 856 and 862. The sub-atmospheric platform 804 is, for example, a CENTURA platform available for Applied Materials, Inc. of Santa Clara, Calif.

The platform 800 also includes a system computer 870 that is coupled to and controls each module that is coupled to the atmospheric and sub-atmospheric platforms 802 and 804, controls the substrate handling devices 812 and 832, and controls the load locks 806 and 808. Generally, the system computer 870 controls all aspects of operation of the platform 800 either by direct control of the sub-systems, modules, tools and apparatus or by controlling the computers associated with those sub-systems, modules, tools and apparatus. The system computer 870 enables feedback from one module or tool to be used to control the flow of substrates through the platform 800 and/or control the processes or operation of the various modules and tools to optimize substrate throughput.

The invention may be practiced in other semiconductor structures and devices wherein the processing parameters may be adjusted to achieve acceptable characteristics by those skilled in the art by utilizing the teachings disclosed herein without departing from the spirit of the invention. While the foregoing is directed to the preferred embodiment of the present invention, other and further embodiments of the invention may be devised without departing from the basic scope thereof, and the scope thereof is determined by the claims that follow.

What is claimed is:

1. A method for removal of residue after plasma etching of a substrate, the method comprising:

providing a substrate comprising a patterned photoresist material layer, a hard mask layer, a conductive layer, and a magnetic layer;

plasma etching of the conductive and hard mask layers of the substrate using the patterned photoresist material layer as an etch mask;

cleaning the substrate in a solution comprising hydrogen peroxide and ammonium hydroxide to remove residue formed during plasma etching.

2. The method of claim 1, wherein the residue comprise a metal.

3. The method of claim 1, wherein the residue comprise at least tantalum.

4. The method of claim 1 further comprising:

removing the photoresist from the cleaned substrate.

5. The method of claim 1, wherein the at least one underlying layer comprises a magnetic layer.

6. The method of claim 5 further comprising:

etching the magnetic layer using a hard mask formed during etching of the hard mask material layer.

7. The method of claim 1, wherein the solution further comprises deionized water.

8. The method of claim 7, wherein the ratio of ammonium hydroxide to hydrogen peroxide is between about 0.1 to 1 to about 1 to 1 by volume.

9. The method of claim 7, wherein a duration of the cleaning of the substrate is between about 1 minute to about 2 minutes.

10. The method of claim 7, wherein a temperature of the solution is between about 45 to about 75 degrees Celsius.

11. The method of claim 7, wherein a temperature of the solution is about 65 degrees Celsius.

12. A method for removal of residue after plasma etching of a substrate comprising a film stack containing a patterned photoresist material layer, a hard mask layer, a conductive layer, and a magnetic layer, the method comprising:

plasma etching of the conductive layer and hard mask layer using the patterned photoresist material layer as an etch mask;

cleaning the substrate in a solution comprising hydrogen peroxide and ammonium hydroxide to remove residue formed during plasma etching of the conductive layer and hard mask layer;

stripping the photoresist material layer from the substrate; and plasma etching the magnetic layer.

13. The method of claim 12, wherein the residue comprise a metal.

14. The method of claim 12, wherein the residue comprise at least tantalum.

15. The method of claim 12, wherein the step of etching the hard mask layer and the conductively layer further comprises:

etching an anti-reflective layer interposed between the hard mask layer and the conductively layer.

16. The method of claim 12, wherein the solution further comprises deionized water.

17. The method of claim 16, wherein the ratio of ammonium fluoride to hydrogen fluoride is between about 0.1 to 1 to about 1 to 1 by volume.

18. The method of claim 16, wherein a duration of the cleaning of the substrate is between about 1 minute to about 2 minutes.

19. The method of claim 16, wherein a temperature of the solution is between about 45 to about 75 degrees Celsius.

20. The method of claim 16, wherein a temperature of the solution is about 65 degrees Celsius.

\* \* \* \* \*

UNITED STATES PATENT AND TRADEMARK OFFICE
CERTIFICATE OF CORRECTION

PATENT NO.     : 6,964,928 B2  
DATED          : November 15, 2005  
INVENTOR(S)    : Ying et al.

It is certified that error appears in the above-identified patent and that said Letters Patent is hereby corrected as shown below:

Column 5,  
Line 11, delete "10 mtorr" and insert -- 10 mTorr --.

Column 6,  
Line 13, delete "2 mtorr" and insert -- 2 mTorr --.  
Line 17, delete "5 mtorr" and insert -- 5 mTorr --.

Signed and Sealed this

Second Day of May, 2006

JON W. DUDAS  
*Director of the United States Patent and Trademark Office*

UNITED STATES PATENT AND TRADEMARK OFFICE
CERTIFICATE OF CORRECTION

PATENT NO. : 6,964,928 B2
APPLICATION NO. : 10/231675
DATED : November 15, 2005
INVENTOR(S) : Ying et al.

It is certified that error appears in the above-identified patent and that said Letters Patent is hereby corrected as shown below:

On column 5, line 25, delete "minutcs" and insert - - minutes - -, therefor.

Signed and Sealed this

Twenty-ninth Day of August, 2006

JON W. DUDAS
*Director of the United States Patent and Trademark Office*